(12) United States Patent
Miyajima

(10) Patent No.: US 7,315,347 B2
(45) Date of Patent: Jan. 1, 2008

(54) EXPOSURE APPARATUS AND DEVICE MANUFACTURING METHOD

(75) Inventor: Yoshikazu Miyajima, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 26 days.

(21) Appl. No.: 11/006,629

(22) Filed: Dec. 8, 2004

(65) Prior Publication Data

US 2005/0140947 A1 Jun. 30, 2005

(30) Foreign Application Priority Data

Dec. 12, 2003 (JP) .............................. 2003-414579

(51) Int. Cl.
G03B 27/52 (2006.01)
G03B 27/42 (2006.01)
(52) U.S. Cl. .......................................... 355/30; 355/53
(58) Field of Classification Search ................. 355/53, 355/30, 55, 67; 359/845, 820
See application file for complete search history.

(56) References Cited

U.S. PATENT DOCUMENTS

| 5,134,436 | A | * | 7/1992 | Fujioka ........................ 355/30 |
| 5,390,228 | A | | 2/1995 | Niibe et al. .................... 378/34 |
| 5,805,273 | A | * | 9/1998 | Unno ........................... 355/30 |
| 5,995,263 | A | * | 11/1999 | Tokuda et al. ............... 359/196 |
| 6,124,064 | A | * | 9/2000 | Ozawa ........................ 430/30 |
| 6,163,365 | A | | 12/2000 | Takahashi ..................... 355/53 |
| 6,504,597 | B2 | * | 1/2003 | Schuster et al. ............... 355/67 |
| 6,521,877 | B1 | * | 2/2003 | Muller-Rissmann et al. ..... 250/201.1 |
| 2002/0159040 | A1 | * | 10/2002 | Hamatani et al. .............. 355/52 |
| 2004/0035570 | A1 | | 2/2004 | Hara .......................... 165/289 |
| 2004/0174504 | A1 | | 9/2004 | Hara et al. .................... 355/30 |
| 2004/0200226 | A1 | | 10/2004 | Hara .......................... 62/3.2 |
| 2004/0218160 | A1 | | 11/2004 | Hara .......................... 355/53 |
| 2004/0227913 | A1 | | 11/2004 | Kino .......................... 355/30 |
| 2004/0227914 | A1 | | 11/2004 | Hara .......................... 355/30 |
| 2004/0227920 | A1 | | 11/2004 | Hara .......................... 355/67 |
| 2005/0128446 | A1 | | 6/2005 | Miyajima ..................... 355/30 |
| 2005/0140947 | A1 | | 6/2005 | Miyajima ..................... 355/30 |
| 2005/0168712 | A1 | | 8/2005 | Miyajima ..................... 355/30 |
| 2005/0185166 | A1 | | 8/2005 | Miyajima et al. ............. 355/75 |

FOREIGN PATENT DOCUMENTS

| EP | 1 447 717 A2 | 8/2004 |
| JP | 5-347239 | 12/1993 |
| JP | 7-270323 | 10/1995 |
| JP | 2004-39696 | 2/2004 |
| JP | 2004-80025 | 3/2004 |
| JP | 2004-228456 | 8/2004 |
| JP | 2004-246039 | 9/2004 |

(Continued)

Primary Examiner—Henry Hung Nguyen
(74) Attorney, Agent, or Firm—Fitzpatrick, Cella, Harper & Scinto

(57) ABSTRACT

An exposure apparatus includes a light source, an illumination optical system for illuminating an original with light from the light source, and a projection optical system for projecting a pattern of the original, illuminated by the illumination optical system, onto a substrate. In addition, a radiation member is disposed opposite to a subject of temperature adjustment which corresponds to at least one of an optical element of the illumination optical system, an optical element of the projection optical system and the original, and a control system controls a temperature of the radiation member in accordance with a state or exposure of the subject of temperature adjustment.

12 Claims, 13 Drawing Sheets

FOREIGN PATENT DOCUMENTS

| | | |
|---|---|---|
| JP | 2004-247438 | 9/2004 |
| JP | 2004-247462 | 9/2004 |
| JP | 2004-247473 | 9/2004 |
| JP | 2004-266265 | 9/2004 |
| JP | 2004-281653 | 10/2004 |
| JP | 2004-311780 | 11/2004 |
| WO | WO 2004/003982 A1 | 1/2004 |

* cited by examiner

EXPOSURE APPARATUS AND DEVICE MANUFACTURING METHOD

FIELD OF THE INVENTION AND RELATED ART

This invention relates to an exposure apparatus and a device manufacturing method, usable in the manufacture of devices having a very fine pattern, such as LSIs, for example.

As a projection exposure apparatus for transferring a reticle pattern onto a silicon wafer in the manufacture of semiconductor devices, EUV exposure apparatuses using EUV light (extreme ultraviolet light) having a wavelength of about 13-14 nm as an exposure light source have been proposed, in which apparatus, a reticle pattern is projected and transferred by use of a mirror optical system and in a vacuum environment.

Referring now to FIGS. 1, 11A, 11B, 12A, 12B, 13A and 13B, the structure of a conventional EUV exposure apparatus will be explained. In FIG. 1, denoted at 1 is an excitement laser in which laser light is projected toward a point where a light source material for producing a light emission point of a light source is gasified, liquefied or gasified by atomization, to cause plasma excitement of atoms of the light source material to thereby produce light emission. A YAG solid laser may be used, for example.

Denoted at 2 is a light source emission unit as an exposure light source, and it has a structure having a vacuum ambience maintained therein. Denoted at 2A is a light emission point (hereinafter, "light source") of the exposure light source. Denoted at 2C is a light source mirror, which is provided as a semi-spherical surface mirror about the light source 2A, for collectively reflecting total-spherical surface light rays from the light source 2A while keeping them in the emission direction. Toward the point of the light source 2A, as a light emission element, any one of liquefied Xe, atomized fog of liquefied Xe, or Xe gas is discharged through a nozzle (not shown). Also, light from the excitement laser 1 is projected thereto.

Denoted at 3 is a vacuum chamber for accommodating therein the whole structure of the exposure apparatus. The vacuum level inside the chamber can be maintained by means of a vacuum pump 4. Denoted at 5 is an exposure light introducing unit for introducing exposure light from the light source light emission point 2 and also for shaping the same. It comprises mirrors 5A-5D, and it functions to homogenize the exposure light and also to shape the same.

Denoted at 6 is a reticle stage, and an original 6A, which is a reflective original of an exposure pattern, is mounted in a movable portion of the reticle stage. Denoted at 7 is a reduction projection mirror optical system for projecting, in a reduced scale, the exposure pattern reflected from the original 6A. The exposure pattern reflected from the original 6A is projected to and reflected by mirrors 7A-7E sequentially, whereby it is reduced and projected on a wafer 8A finally at a predetermined reduction magnification. Denoted at 8 is a wafer stage, which can be controllably positioned with respect to six axes of the X, Y and Z directions, tilt directions about the X and Y axes, a rotational direction about the Z axis, so as to position the wafer 8A (Si substrate) to which the pattern reflectively projected from the original 6A is to be transferred.

Denoted at 9 is a reticle stage support for supporting the reticle stage 6 with respect to the floor where the apparatus is mounted. Denoted at 10 is a projection system support for supporting the reduction projection mirror system 7 with respect to the floor. Denoted at 11 is a wafer stage support for supporting the wafer stage 8 with respect to the floor. Between the reticle stage 6 and the reduction projection mirror optical system 7 and between the reduction projection mirror system 7 and the wafer stage 8, which are isolated and independently supported by means of the above-described reticle stage support 9, the projection system support 10 and the wafer stage support 11, there is provided means (not shown) having a function for measuring the relative position and for maintaining the components at a predetermined relative position.

The reticle stage support 9, the projection system support 10 and the wafer stage support 11 are provided with a mount (not shown) for insulating them against vibration from the floor where the apparatus is mounted.

Denoted at 12 is a reticle stocker for temporarily storing therein reticles (originals 6A) from the outside of the machine to the inside of the machine. A plurality of reticles, having different patterns and corresponding to different exposure conditions, are stored in a storing container. Denoted at 13 is a reticle changer for choosing a reticle to be used, out of the reticle stocker 12, and for conveying the same. Denoted at 14 is a reticle alignment unit having a rotary hand, which is movable in X-, Y- and Z-axis directions and rotatable around the Z axis. The reticle alignment unit receives an original 6A from the reticle changer 13, and rotates it by 180 degrees. Then, the reticle alignment unit conveys the original 6A toward a reticle alignment scope 15 portion, which is provided at an end portion of the reticle stage 6, and then brings it into alignment with an alignment mark 15A (see FIG. 11) provided on a reference of the reduction projection mirror optical system 7, by minutely moving the original 6A in X-, Y- and Z-axis directions and in a rotational direction about the Z axis. After completion of the alignment, the original 6A is chucked onto the reticle stage 6.

Denoted at 16 is a wafer stocker for temporarily storing wafers 8A from the outside of the machine to the inside of the machine. A plurality of wafers are stored in a storing container. Denoted at 17 is a wafer conveying robot that functions to choose a wafer 8A to be processed, out of the wafer stocker 16, and conveys the same to a wafer mechanical prealignment temperature adjuster 18. The wafer mechanical prealignment temperature adjuster 18 has a function for performing feed coarse alignment of the wafer in the rotational direction and a function for simultaneously adjusting the wafer temperature in registration with an inside adjusted temperature of the exposure apparatus. Denoted at 19 is a wafer supply hand, and it functions to introduce and load the wafer 8A, having been aligned and temperature adjusted at the wafer mechanical prealignment temperature adjuster 18, onto the wafer stage 8.

Denoted at 20 and 21 are gate valves, which function as a gate opening/closing mechanism, through which a reticle and a wafer can be inserted from outside the machine. Denoted at 22 is also a gate valve. Inside the apparatus, the exposure space and the space for the wafer stocker 16 and the wafer mechanical prealignment temperature adjuster 18 are isolated from each other by means of a partition wall, and the gate valve 22 is opened only when a wafer 8A is loaded and unloaded. With this isolation using a partition, the volumetric capacity to be opened to the atmosphere as a wafer 8A is loaded from and unloaded back to the outside of the machine can be minimized, so that a vacuum balanced state can be resumed quickly.

In FIGS. 11A, 11B, 12A and 12B, denoted at 6B is a reticle chuck slider, and denoted at 6C is a reticle driving means. Denoted at 6F is an electrostatic chuck electrode. Denoted at 14A is a reticle alignment hand, and denoted at 14B is a reticle alignment electrostatic chuck. Denoted at 37 is an original alignment control circuit.

In the exposure apparatus described above, the light source mirror 2C for collecting exposure light from the light source light emitting unit 2 as the exposure operation starts from the non-exposure period, the mirrors 5A-5D of the exposure light introducing unit for introducing and shaping the collected exposure light, and the mirrors 7A-7E of the reduction projection mirror optical system for reducing and projecting an exposure pattern reflected from the original 6A are all formed with a Mo—Si multilayered film, produced by vapor deposition or sputtering, so that the exposure light from the light source 2A is assuredly reflected by the individual reflection surfaces. The reflectance per each surface is approximately 70%, and the remainder is absorbed by the mirror base material and is converted into heat.

FIG. 13A shows an example of temperature changes at the projection system mirrors D and E (mirrors 7D and 7E in FIG. 1). With reference to the projection system mirror temperature T1 during the non-exposure period, the mirror temperatures gradually increase as the exposure starts, and they reach temperatures T4 and T3 and they are stabilized there. Here, in the exposure light reflecting area, the temperature rises and, as a result, even if a mirror material having a very small thermal expansion coefficient is used, at the mirror peripheral portion, the reflection surface will be shifted to such an extent that the precision of the projection system mirrors 7A-7E, the illumination system mirrors 5A-5D and the light source mirror 2C, for which very strict mirror surface shape precision is required, cannot be compensated for any more.

If the mirror surface precision is degraded as described, for the projection system, the imaging performance on the wafer is degraded and the illuminance is lowered as well. For the illumination system, on the other hand, the target illuminance on the mask is degraded, and non-uniformness of illuminance becomes worse. For the light source mirror, the illuminance is degraded such as by defective light collection of the light source, for example. Generally, these degradations lead to deterioration of the basic performance such as exposure precision or throughput of the exposure apparatus, for example.

As regards the original, on the other hand, a similar problem will occur like the case of the reflection mirrors described above. FIG. 13B shows an example of temperature change of an original. With reference to an original's temperature T1 during a non-exposure period, the temperature of the original surface gradually increases as the exposure starts, and it reaches a temperature T2 and is stabilized thereat. Here, in the exposure light reflection area of the original pattern, the temperature rises and, as a result of it, even if an original mirror material having a very small thermal expansion coefficient is used, the original pattern reflection surface will be shifted. As a result of it, distortion of the original pattern, as well as pattern magnification error, will be produced, which will lead to degradation of the resolution precision.

SUMMARY OF THE INVENTION

It is accordingly an object of the present invention to provide an exposure apparatus by which at least one of the inconveniences described above can be removed or reduced.

In accordance with an aspect of the present invention, there is provided n exposure apparatus, comprising a light source, an illumination optical system for illuminating an original with light from the light source, a projection optical system for projecting a pattern of the original, illuminated by the illumination optical system, onto a substrate, a radiation member disposed to be opposed to a subject of temperature adjustment, which corresponds to at least one of an optical element of the illumination optical system, an optical element of the projection optical system and the original, and a control system for controlling a temperature of the projection optical system and the original, and a control system for controlling a temperature of the radiation number in accordance with a state of exposure of the subject of the temperature adjustment.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

Embodiment 1

Figure 1:
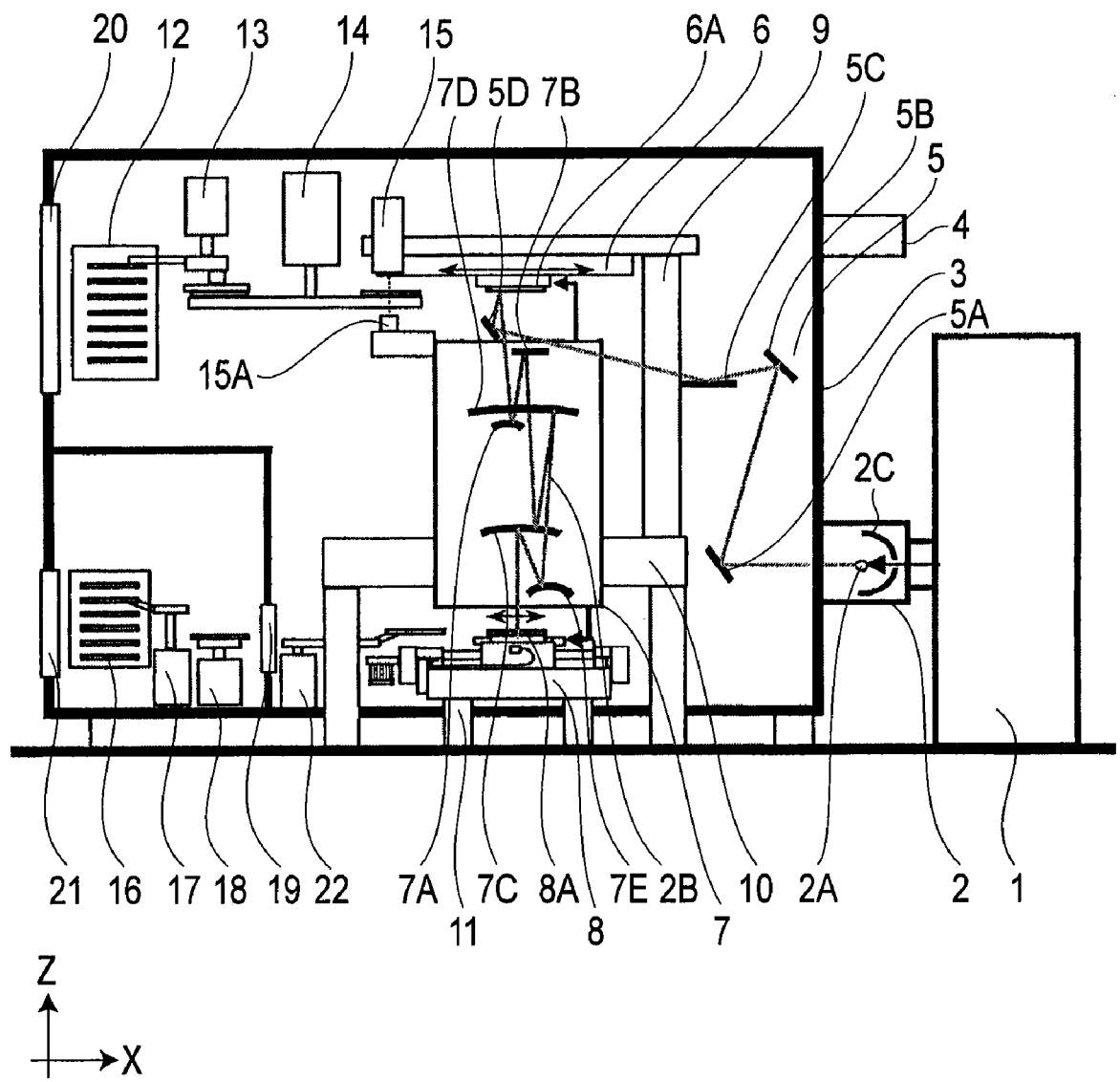
FIG. 1 is a schematic view of a general structure of an exposure apparatus according to an embodiment of the present invention.
Figure 2A:
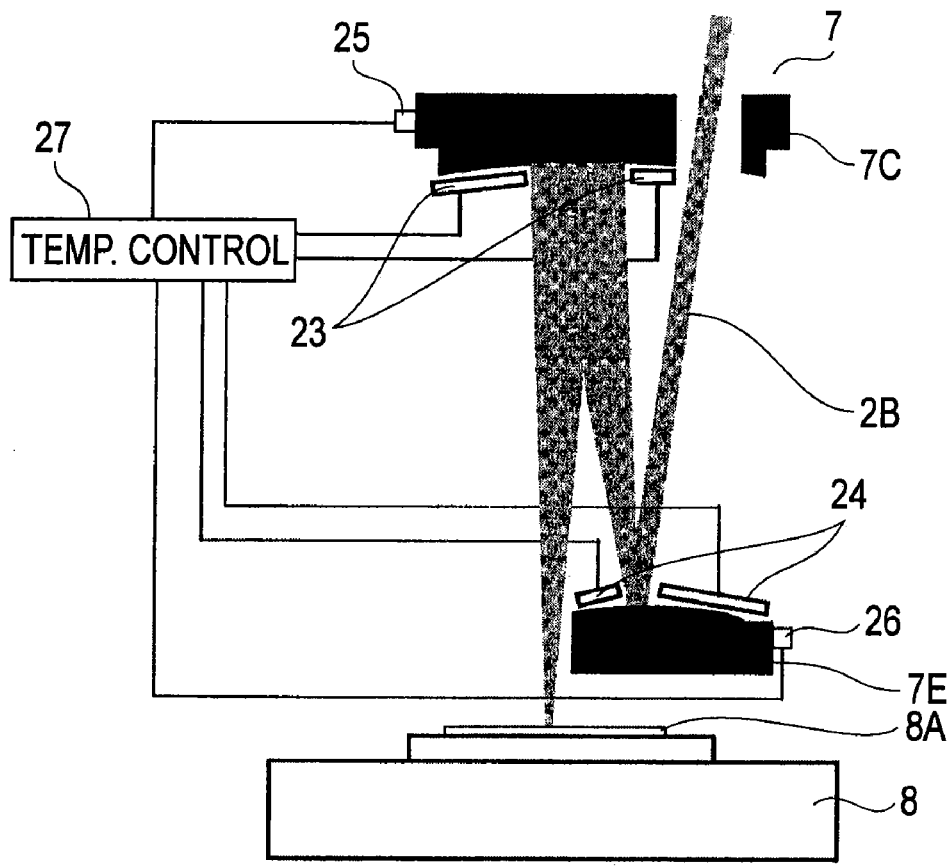
FIGS. 2A and 2B illustrate the structure and function of projection system mirrors and temperature adjusting means for the same, according to the first embodiment of the present invention.

FIG. 1 is a schematic view showing a general structure of an EUV exposure apparatus according to an embodiment of the present invention. As compared with the conventional structure described hereinbefore, the exposure apparatus of this embodiment comprises mirror temperature adjusting means 23 for performing radiation temperature-adjustment at a position spaced from a projection system mirror 7C, as shown in FIG. 2A, mirror temperature adjusting means for performing radiation temperature-adjustment at a position spaced from a projection system mirror 7E, mirror temperature detecting means 25 for measuring the temperature of the mirror 7C, mirror temperature detecting means 26 for measuring the temperature of the mirror 7E, and temperature control means for determining a set temperature for the mirror temperature adjusting means 23 and 24 in accordance with temperature measured values from the mirror temperature detecting means 25 and 26. The remaining portion of this embodiment has a similar structure as that of the conventional structure. What differs from the conventional structure will be described below, mainly.

Referring to FIG. 2A, during a non-exposure period of the exposure apparatus, exposure heat quantities to be incident on the mirrors 7C and 7E, respectively, are predicted and, in accordance with the predicted temperature rise of the mirrors, the mirrors 7C and 7E are preheated by radiation temperature-adjustment from their reflection surface side, by use of the mirror temperature adjusting means 23 and 24. Here, the temperature of the mirrors themselves are detected by using the mirror temperature detecting means 25 and 26, respectively, and the temperatures of the mirror temperature adjusting means 23 and 24 are controlled by use of the temperature control means 27.

Figure 2B:
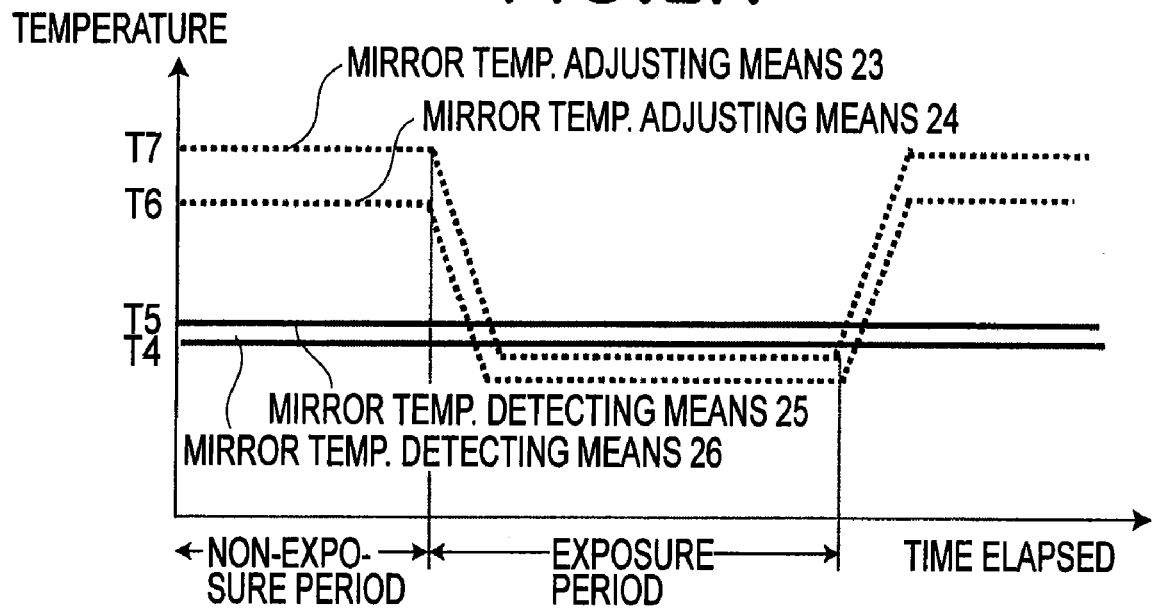

FIG. 2B illustrates details of the temperature control, wherein the axis of abscissa depicts the time elapsed as the process changes over from the non-exposure state to the exposure state, and wherein the axis of ordinate depicts temperatures at various positions.

From a predicted incidence light quantity in the exposure period, per unit time, on each mirror, a predicted temperature rise of each mirror is calculated. Then, during the non-exposure period, the set temperature for the mirror temperature adjusting means 23 and 24 are placed at temperatures T7 and T6, respectively. Here, the temperatures of the mirrors are specified by the mirror temperature detecting means 25 and 26, respectively, as T5 and T4, respectively. If the temperatures of the mirrors 7C and 7E during the non-exposure period do not reach the temperatures T5 and T4 for the exposure period, the set temperatures of the temperature adjusting means 23 and 24 are negative-feedback controlled on the basis of the measured temperatures of the mirror temperature detecting means 25 and 26. Alternatively, on the basis of the past exposure hysteresis and temperature hysteresis, the set temperatures T7 and T6 of the mirror temperature adjusting means 23 and 24 may be corrected.

During the exposure period, on the other hand, the exposure light from the light source 2A is reflected by the mirrors 5A-5D of the exposure light introducing unit and the mirrors 7A-7E of the reduction projection mirror optical system, each mirror having a reflection surface formed with a Mo—Si multilayered film applied by vapor deposition or sputtering. The reflectance of each mirror is approximately 70%, and the remainder is absorbed by the mirror base material and is converted into heat. Thus, the temperature at the exposure light reflection area rises. In this embodiment, in consideration of this, the temperature difference between the non-exposure period and the exposure period is prevented. To this end, simultaneously with the start of exposure, the temperatures of the mirror temperature adjusting means 23 and 24 are gradually lowered from T7 and T6, respectively, so that, in the steady state of the exposure period, the temperatures of the mirror temperature adjusting means 23 and 24 become lower than the mirror temperatures. By doing so, the mirror temperatures are balanced with the temperature rise due to the incidence light quantity of exposure light and, as a result of this, the mirror temperatures can be maintained constant.

In this embodiment, as described above, the temperature of each reflection mirror during the non-exposure period is made substantially at the same level as that during the exposure period and, by doing so, transitional temperature change of the reflection mirror at the start of exposure is avoided. Thus, distortion of the reflection mirror can be prevented, and degradation of aberration due to the mirror temperature change at the start of exposure can be avoided. Therefore, a high-precision exposure apparatus can be accomplished. The concept of this embodiment is applicable to any of reflection mirrors 2C, 5A-5D, and 7A-7E from the light source 2A to the wafer 8A, and the reflection mirror distortion can be similarly prevented. Additionally, the invention is applicable not only to a reflection mirror, but also to an original (reticle) 6A. On that occasion, transitional temperature change of the original at the start of exposure can be avoided, and distortion of the original can be prevented. Thus, pattern distortion of the original resulting from temperature change of the original at the start of exposure can be prevented, and a high precision exposure apparatus can be accomplished.

Embodiment 2

Figure 3:
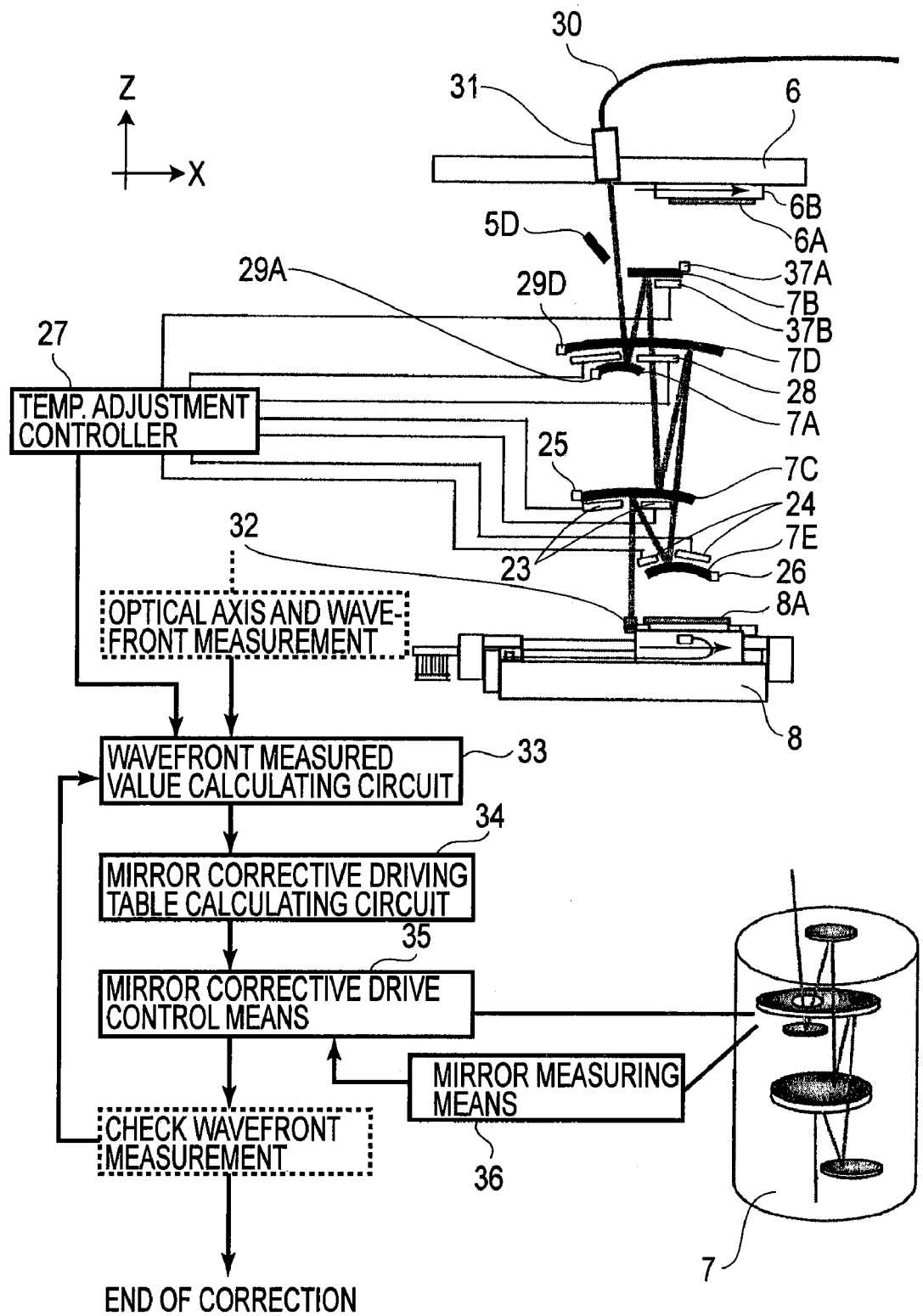
FIG. 3 illustrates the structure and function of projection system mirrors and temperature adjusting means for the same, according to a second embodiment of the present invention.

FIG. 3 shows a second embodiment, which is directed to an example wherein, for optical axis adjustment of a reduction projection mirror system 7 or aberration adjustment of reflection mirrors, to be performed on the main assembly of an exposure apparatus, temperature adjustment by radiation is carried out to the mirrors.

In FIG. 3, in relation to mirrors 7A and 7D, there is mirror temperature adjusting means 28 disposed spaced from these mirrors. In relation to a mirror 7B, there is mirror temperature adjusting means 37B disposed spaced from this mirror. In relation to a mirror 7C, there is mirror temperature adjusting means 23 disposed spaced from this mirror. In relation to a mirror 7E, there is mirror temperature adjusting means 24 disposed spaced from this mirror.

There are mirror temperature detecting means 29A, 37A, 25, 29D and 26, associated with the mirrors 7A-7E, respectively. Temperature measured values from these mirror temperature detecting means are collected to temperature control means 27.

For measurement of an optical axis and aberration of the reduction projection mirror optical system 7, a wavefront measuring light supplying fiber 30 introduces measuring light from the back of the reticle stage. The measuring light then goes out from a wavefront measuring light exit port 31. The light from the port 31 is incident on and reflected by the mirrors 7A-7E sequentially, and finally, it is received and detected by an optical axis and wavefront measuring light sensor 32.

Denoted at 33 is a wavefront measured value calculating circuit for calculating the optical axis and wavefront aberration, on the basis of a signal from the sensor 32. Denoted at 34 is a mirror corrective drive table calculating circuit that calculates a mirror corrective drive amount on the basis of an optical axis deviation and aberration remainder as calculated by the wavefront measured value calculating circuit 33. Denoted at 35 is a mirror corrective drive means for performing corrective drive to the mirror, on the basis of a corrective drive signal from the table calculating circuit 34. The mirror corrective drive means 35 is operable to minutely move a mirror supporting actuator (not shown) in X, Y and Z directions, thereby to enable correction of the mirror surface in translational shift directions along its plane as well as correction of minute displacement and fall of the rotational axis. Denoted at 36 is mirror measuring means for detecting a mirror corrective drive amount.

In the structure described above, in order to adjust the optical axis and aberration of the reduction projection mirror optical system 7, set temperatures of respective mirror temperature adjusting means for the respective mirrors are calculated on the basis of the measured values from the mirror temperature detecting means 29A, 37A, 25, 29D and 26, as collected to the temperature adjustment control means 27, as well as the set temperatures of the mirrors during the exposure period. Based on this, the temperatures of the mirror temperature adjusting means 23, 24, 28 and 38 are controlled, whereby the temperatures of the respective mirrors can be controlled to those levels corresponding to the temperatures in the exposure period. The temperature control means 27 checks whether the mirror temperatures reach the levels corresponding to the temperatures during the exposure period, and, after it is discriminated, while the reticle chuck slider 6B of the reticle stage 6 is held retracted, the wavefront measuring light supplying fiber 30 supplies measuring light as illustrated in the drawing. Then, the measuring light goes out of the wavefront measuring light exit port 30 (from which wavefront evaluating light is provided), and the measuring light is reflected by all the reflection surfaces of the projection system mirrors, sequentially. Finally, as shown in the drawing, it is received by the optical axis and wavefront measuring light receiving sensor 32 mounted on the movable portion of the wafer stage 8, whereby the amount of optical axis deviation of the projection system through the whole reflection mirrors as well as the amount of optical wavefront aberration of the same are measured. The optical axis and wavefront measured value obtained at the sensor 32 is applied to the wavefront measured value calculating circuit 33, by which the optical axis and wavefront aberration corrective amount is calculated. On the basis of the thus calculated optical axis and wavefront aberration corrective amount, the mirror corrective drive table calculating circuit 34 calculates the corrective drive directions and corrective drive amounts for the mirrors 7A-7E, as well as force application amounts therefor. These calculated amounts are transmitted to the mirror corrective drive control means 35 as target values. Simultaneously therewith, information from the mirror position measuring means (not shown) for measuring the position of the mirrors 7A-7E are collected to the mirror measuring means 36, whereby the relative position of the mirrors is measured.

By using the mirror corrective drive means 35 and the mirror measuring means 36, the mirrors are moved to their target positions, respectively. After this, the optical axis and wavefront aberration are measured and checked again. If the optical axis and the wavefront aberration satisfy a standard level, the correction is completed. If the standard level is not satisfied, on the other hand, residual wavefront aberration is calculated by the wavefront measurement calculating circuit and the above-described correction is repeated to get the target standard level.

As described above, by performing the optical axis and aberration adjustment while keeping the mirror temperatures at the level corresponding to the temperatures in the exposure period, stable optical axis and aberration can be satisfied in the state equivalent to the exposure period. Namely, in accordance with this embodiment, for optical axis adjustment of a projection optical system or for aberration adjustment of reflection mirrors, the reflection mirrors are preheated by use of a radiation temperature-adjusting heater, by which optical axis adjustment or aberration adjustment in the state corresponding to the exposure operation period are assured. Thus, an exposure apparatus having small aberration production and variation during the exposure process, can be accomplished.

Embodiment 3

Figure 4A:
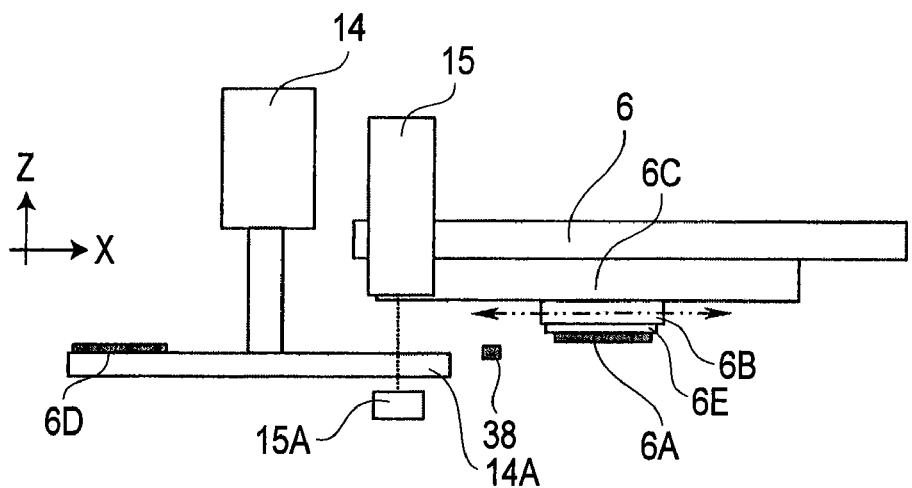
FIGS. 4A, 4B and 4C are schematic views, respectively, showing a reticle conveying system, a reticle stage and reticle temperature adjusting means, according to a third embodiment of the present invention.

Referring to FIGS. 4A-7, a third embodiment of the present invention will be explained. In the first and second embodiments described hereinbefore, the present invention is applied with respect to temperature adjustment during the non-exposure period of the projection system mirrors. However, the invention is applicable also to an original. Thus, in this embodiment, as shown in FIG. 4A, a temperature adjusting radiation plate 38 is provided so as to be spaced from and opposed to a position, at a side of the reticle alignment scope 15, to which the reticle stage 6 is to be retracted.

The sequence of reticle replacement is illustrated in FIGS. 4A-4C, 5A and 5B.

Referring to FIG. 4A, for changing original (reticles) 6A and 6D, initially, the original 6D is placed on and held by a reticle alignment hand 14, while a reticle chuck slider 6B, having the original 6A mounted thereon, moves to the reticle changing position.

Figure 4B:
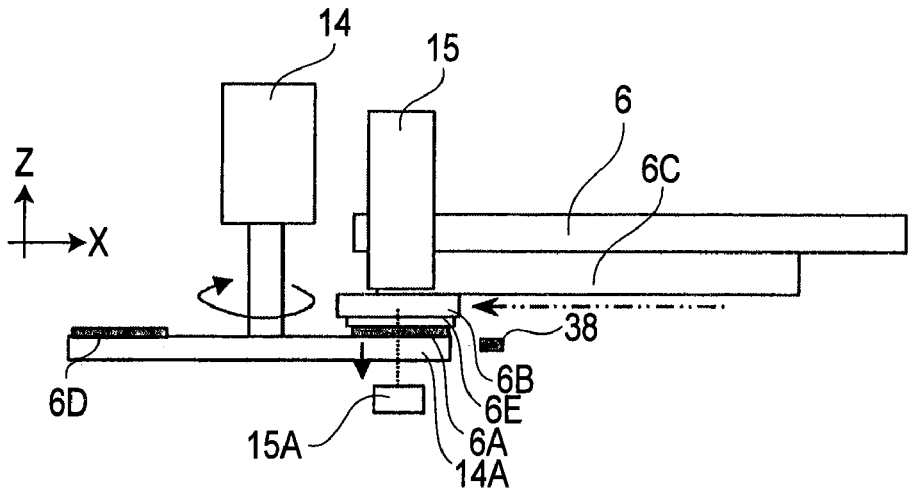
Figure 4C:
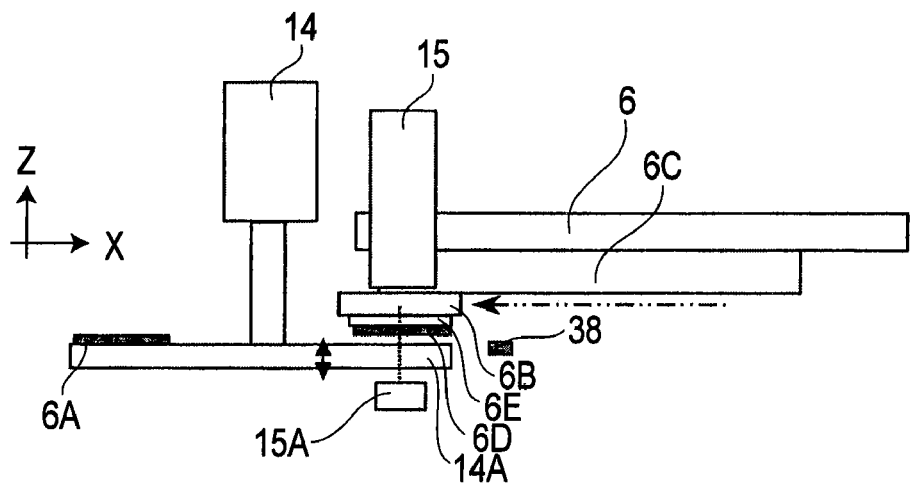

Then, the reticle alignment hand 14A is moved by the reticle alignment unit 14 from the FIG. 4A position, upwardly as shown in FIG. 4B. After this, the original 6A is transferred to the reticle alignment hand, from the reticle chuck 6E of the reticle chuck slider 6B. Subsequently, the reticle alignment hand is retracted downwardly and then it is rotationally moved, whereby the reticle changing is completed as shown in FIG. 4C.

Figure 5A:
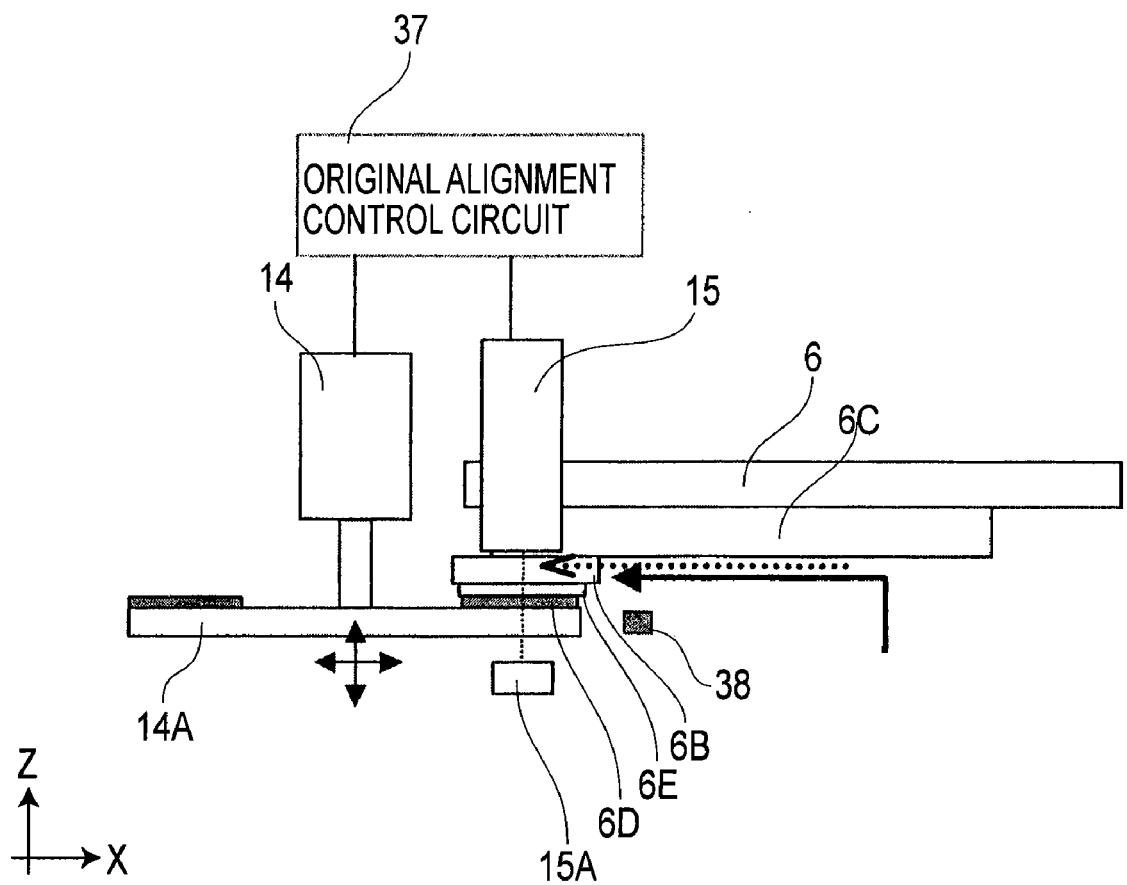
FIGS. 5A and 5B are schematic views for explaining reticle alignment in the structure shown in FIGS. 4A-4C.
Figure 5B:
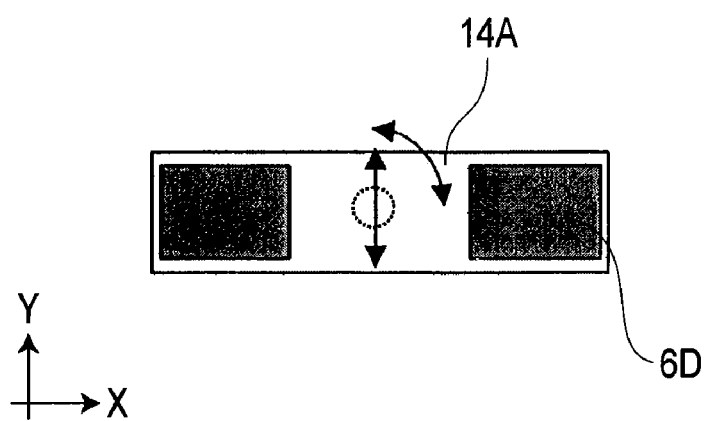

Next, an alignment operation for an original (reticle) with respect to the reticle stage will be explained. As shown in FIG. 5A, an alignment operation is made to an original (reticle) 6D having been attracted to and conveyed by a reticle alignment electrostatic chuck (not shown), which is provided on the reticle alignment hand 14A. Namely, a positional error of the original 6A is measured and detected by means of a reticle alignment scope 15 and from a relative alignment error with respect to a reticle alignment mark 15A. Then, an original alignment control circuit 37 controllably drives the reticle alignment unit 14 to perform alignment operation through the reticle alignment hand 14A, with respect to the X and Y directions (directions along the plane) and the $\omega Z$ direction (rotational direction about the Z axis), whereby alignment of the original 6D is accomplished. At the moment whereat the alignment of the original 6D is completed, the bottom face (upper surface) of the original 6D is attracted and clamped by means of a reticle chuck (electrostatic chuck) 6E of the reticle chuck slider 6B, on the basis of Coulomb's force or Johnson-Rahbek force.

The reticle chuck slider 6B is provided with a reticle and a reticle chuck slider temperature detecting means 6G (see FIG. 6A), which is arranged to detect the temperature of the original 6D as the same is being clamped by attraction by the reticle chuck slider 6B.

Figure 6A:
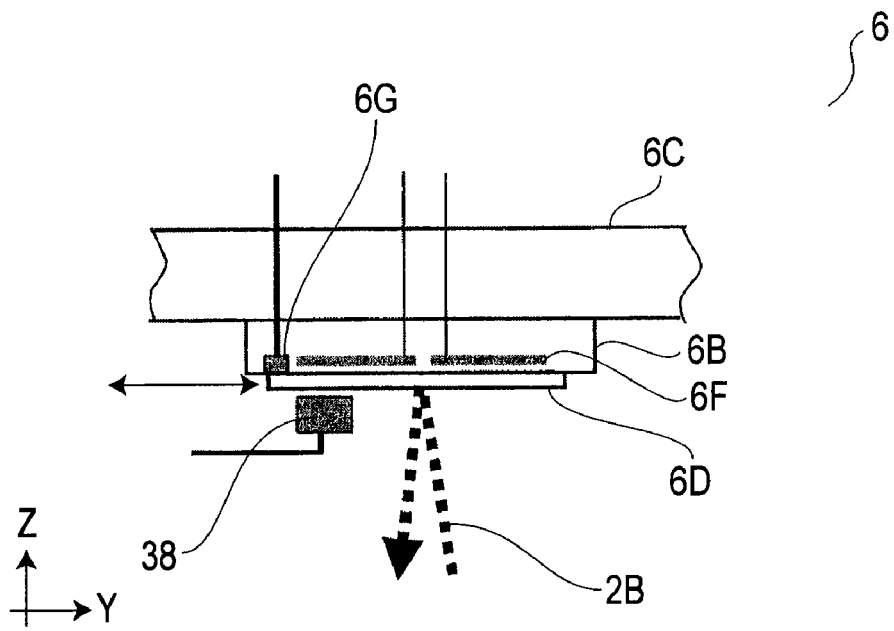
FIGS. 6A and 6B are a schematic view and a diagrammatic view, respectively, for explaining a reticle temperature adjustment in the structure of FIGS. 4A-4C.
Figure 6B:
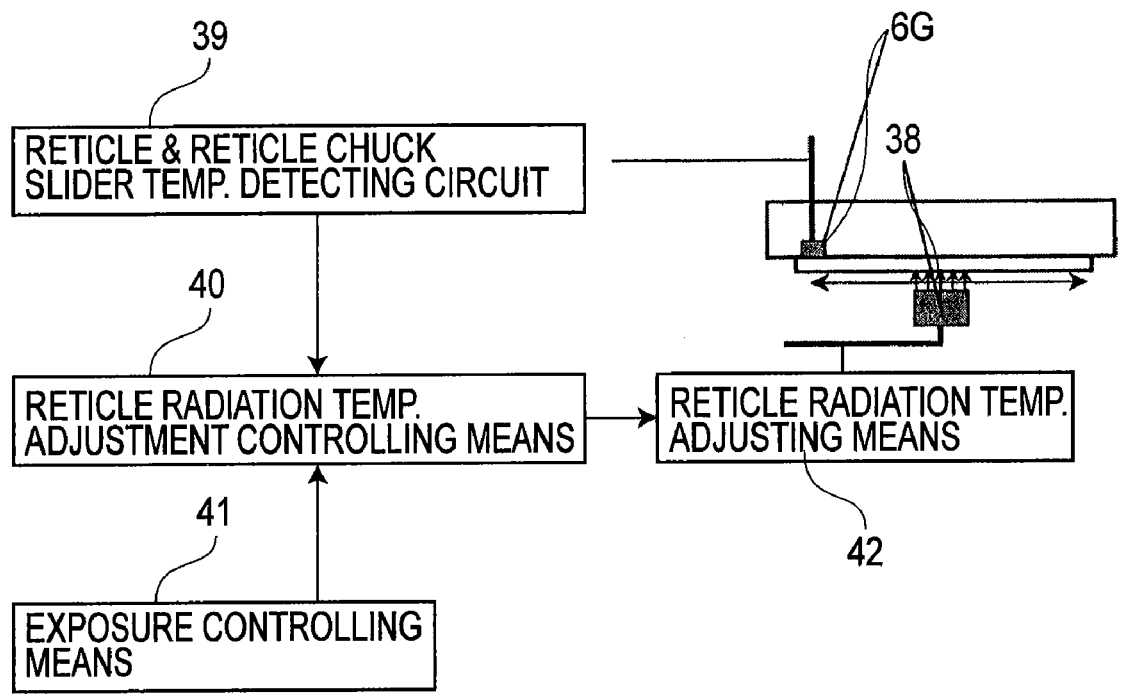
Figure 7:
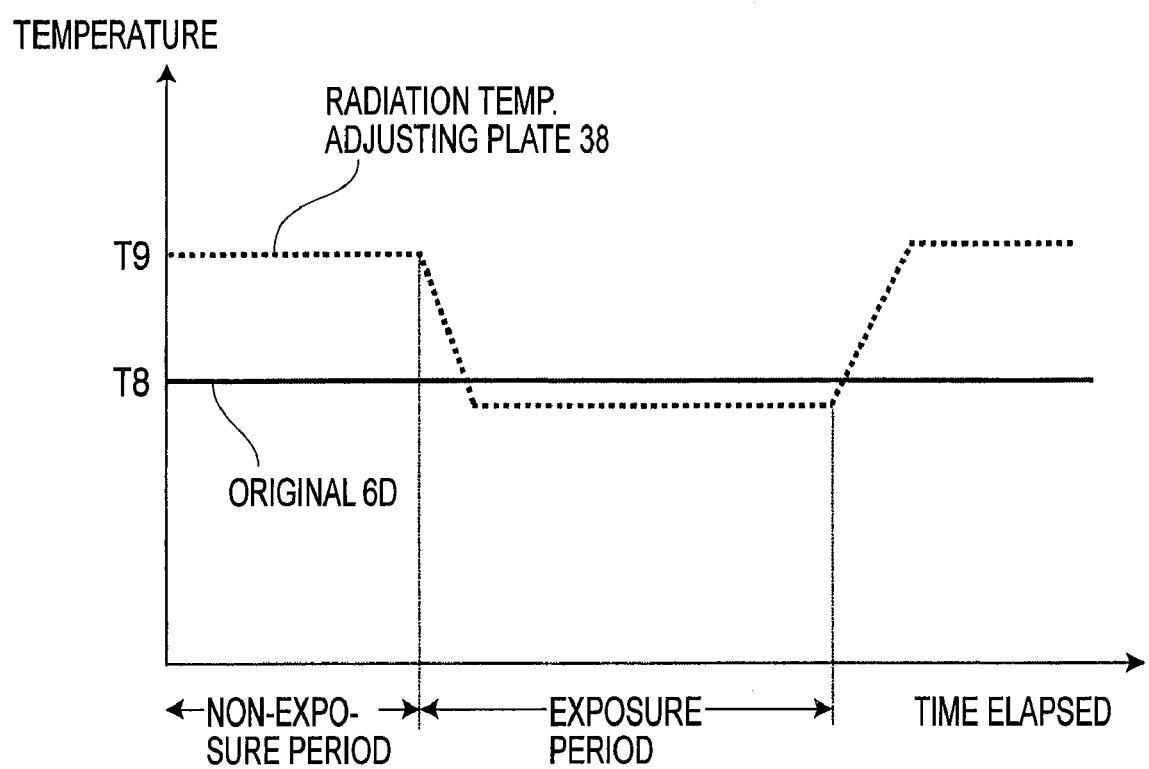
FIG. 7 is a graph for explaining temperature changes of a radiation temperature adjusting plate and of a reticle, in the structure of FIGS. 4A-4C.

Referring to FIGS. 6A, 6B and 7, the preheating operation of the original (reticle) 6D during the non-exposure period will be explained. As best seen in FIG. 6A, the temperature adjusting radiation plate 38 is provide at a position to be opposed to the position upon the original 6D that is retracted away from the incidence position of the exposure light 2B.

Namely, the original 6D is moved to the position to be opposed to the temperature adjusting radiation plate 38, and the temperature of the original 6D is measured by use of the reticle and reticle chuck slider temperature detecting means 6G, which is provided on the reticle chuck slider 6B. The measured value is transmitted to a reticle and reticle chuck slider temperature detecting circuit 39, and a corrective temperature amount is calculated. At the same time, from the exposure amount information of light to be incident on an original (reticle), incidence heat quantity information concerning the heat quantity to be incident on the original is predicted. On the basis of the exposure amount information and the incidence heat quantity information, a reticle radiation temperature-adjustment control means 40 determines a temperature-adjusting set temperature for the reticle 6D during the non-exposure period. Then, a reticle radiation temperature-adjusting means 42 controls the temperature of the temperature adjusting radiation plate 38.

In order to assure that radiation temperature-adjustment from the temperature adjusting plate 38 to an effective pattern region (exposure light incidence region) of the original 6D, the reticle chuck slider 6B reciprocally moves relative to the temperature adjusting radiation plate 38.

Through the temperature adjustment of the original (reticle) during the non-exposure period as described above, preheating is carried out while taking the temperature T9 of the radiation temperature-adjusting plate 38 in the non-exposure period as a set temperature (FIG. 7) and, as a result, the temperature of the original (reticle) 6D is brought to the level T8. From this state, as the exposure starts, the set temperature of the radiation temperature-adjusting plate 38 is lowered in accordance with the temperature rise of the original (reticle) due to irradiation with exposure light. Namely, temperature control is done so that the sum of the heat quantity from the radiation temperature-adjusting plate 38 and the heat quantity by the exposure light is kept substantially constant. With this temperature control, even after a start of exposure, the temperature of the original 6D can be maintained at a constant level T8.

With this procedure, transitional distortion or change in shape of the original (reticle), during a transitional period from the non-exposure state to the start of exposure, can be avoided effectively. Thus, a shift of magnification of the original (reticle) pattern, for example, can be prevented.

Embodiment 4

Figure 8A:
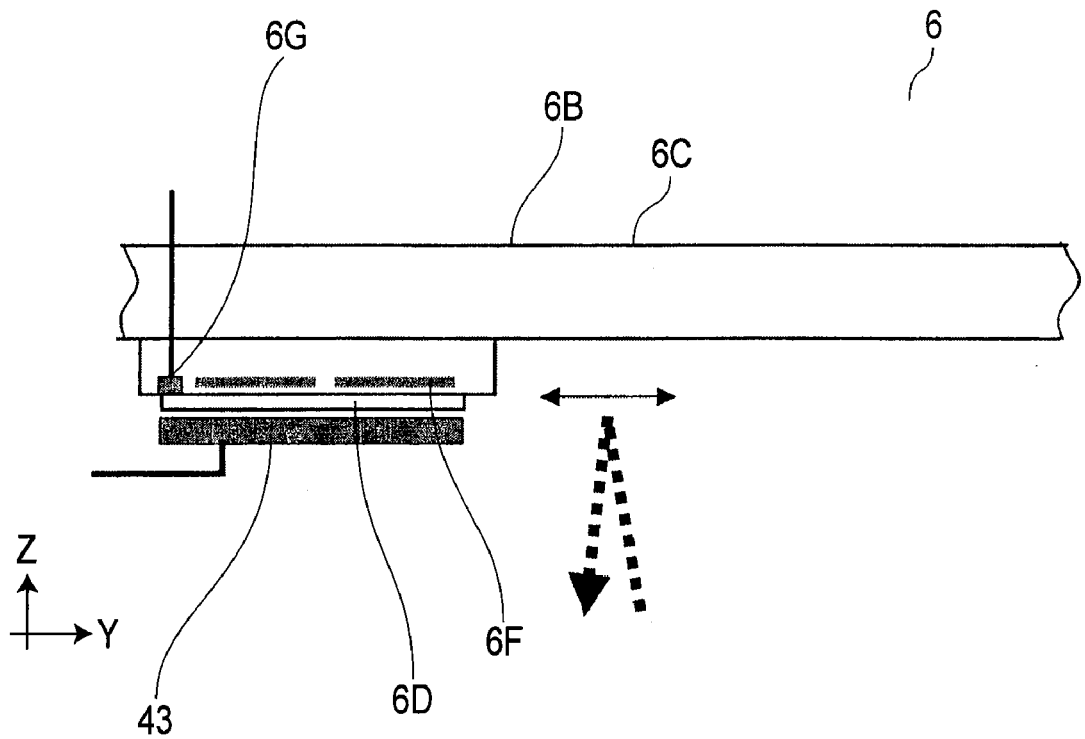
FIGS. 8A and 8B are schematic views for explaining reticle temperature adjustment in a fourth embodiment of the present invention.
Figure 8B:
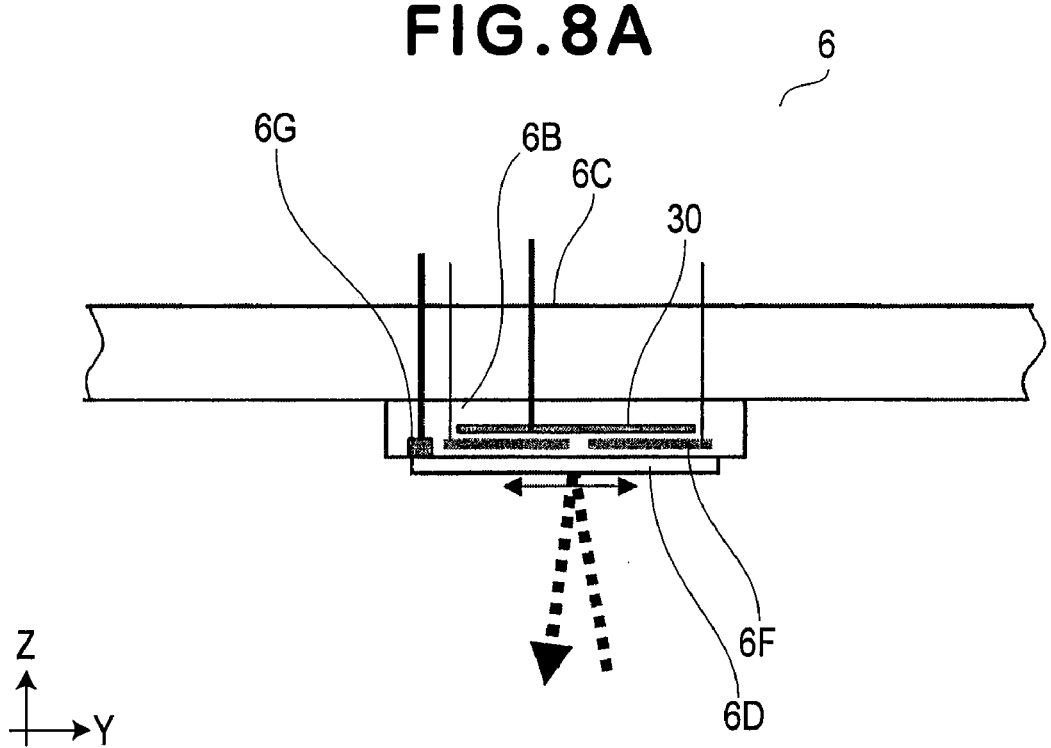

In the third embodiment described above, the original is relatively reciprocally moved relative to the temperature adjusting radiation plate 38 of a relatively small size, to assure uniform temperature adjustment. However, as shown in FIG. 8A, a temperature adjusting radiation plate 43 of a relatively large size, corresponding to the effective area of the original (reticle) pattern, may be provided at a position to be opposed to and spaced from the original as the same is retracted. This enables temperature adjustment while the reticle 6D is held stationary.

Embodiment 5

In the first to fourth embodiments described hereinbefore, radiation temperature-adjusting means is used as preheating means for the mirror temperature and the mask temperature. As an alternative for keeping the mirror temperature or mask temperature constant, exposure light may be irradiated without loading a substrate (wafer), during the non-exposure period, to thereby preheat the mirror temperature or the mask temperature to a level corresponding to the temperature during the exposure period. On that occasion, the original (reticle) stage as well may perform approximately the same operation as done in the exposure period, by which preheating temperature adjustment of the original (reticle) can be achieved.

Embodiment 6

Next, an embodiment of a device manufacturing method, which uses an exposure apparatus described above, will be explained.

Figure 9:
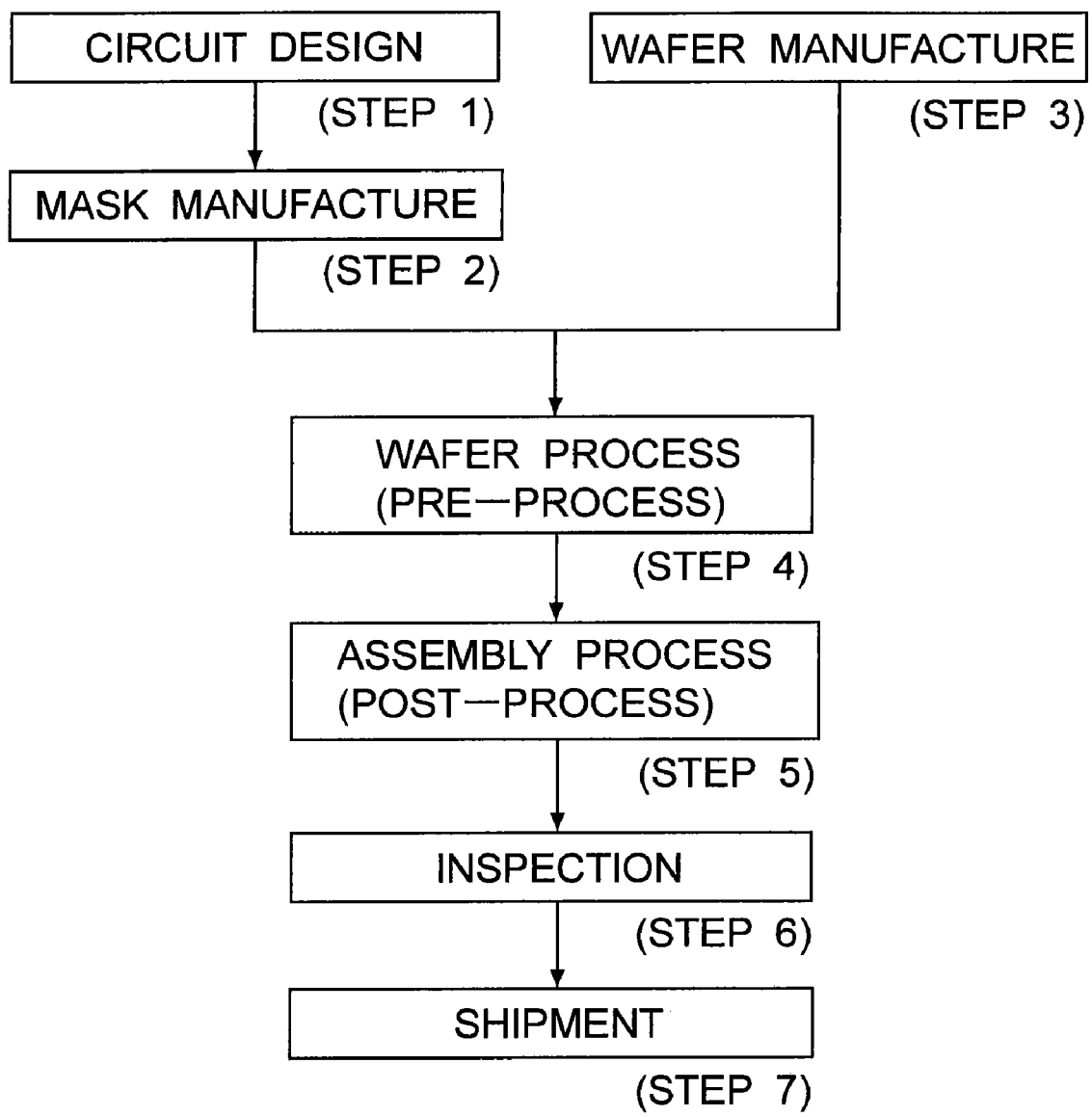
FIG. 9 is a flow chart for explaining the sequence of device manufacturing processes.

FIG. 9 is a flow chart for explaining the procedure of manufacturing various microdevices such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5, subsequent to this, is an assembling step, which is called a post-process, wherein the wafer having been process at step 4 is formed into semiconductor chips. This step includes an assembling (dicing and bonding) process and a packaging (chip sealing) process. Step 6 is an inspection step wherein an operation check, a durability check, and so on, for the semiconductor devices produced by step 5, are carried out. With these processes, semiconductor devices are produced, and they are shipped (step 7).

Figure 10:
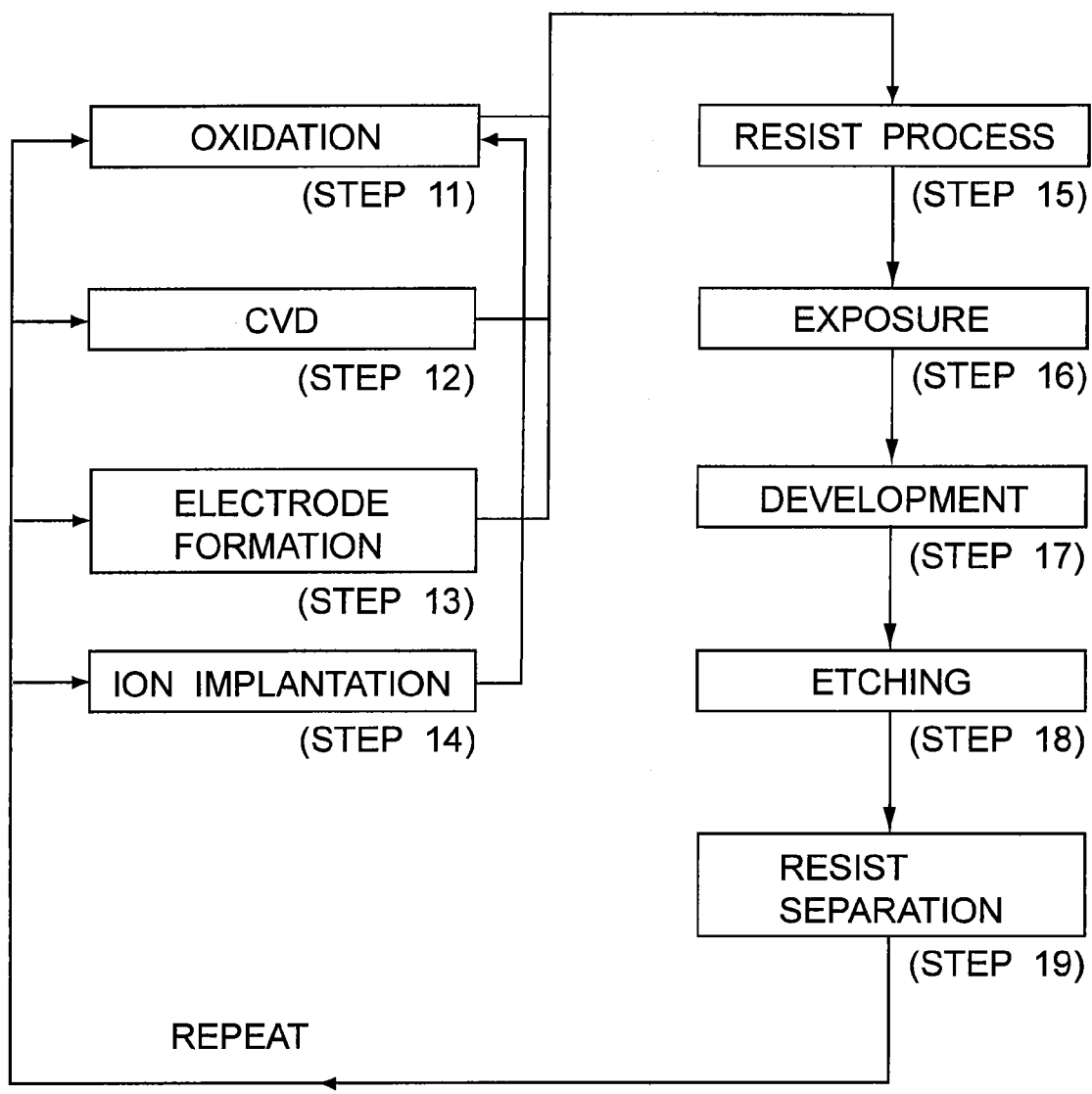
FIG. 10 is a flow chart for explaining details of a wafer process included in the procedure of FIG. 9.
Figure 11A:
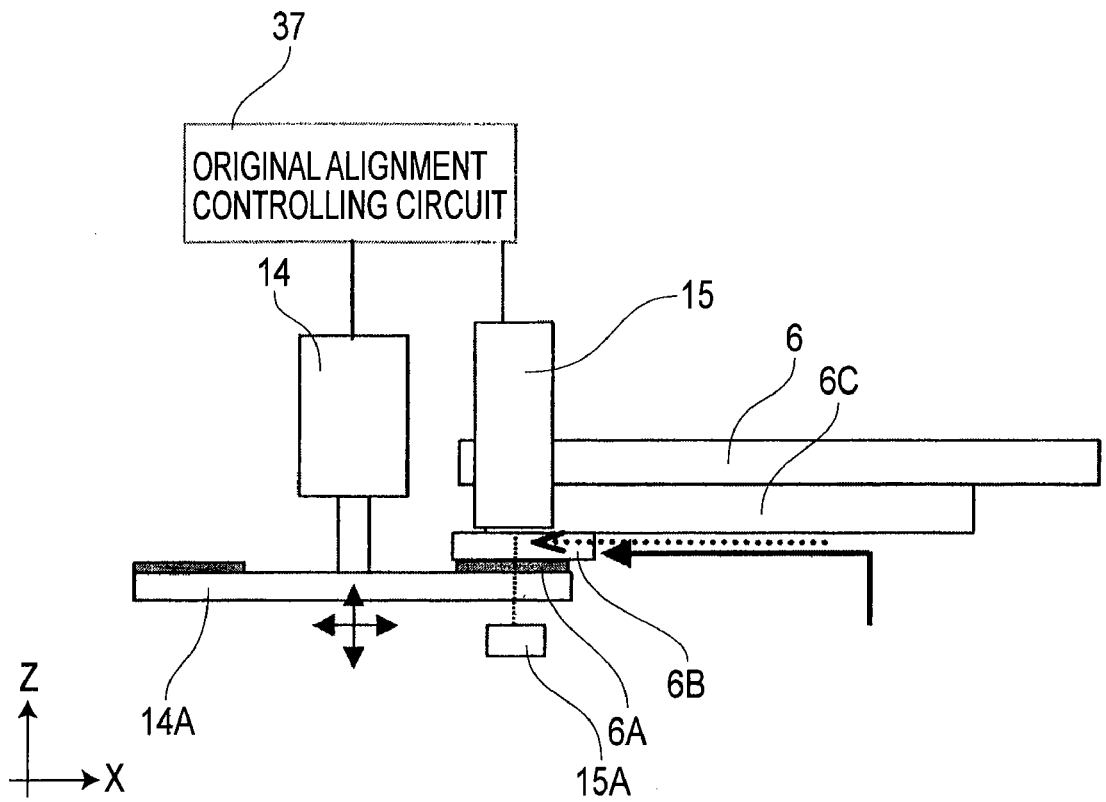
FIGS. 11A and 11B are schematic views for explaining the structure of a conventional reticle alignment mechanism.
Figure 11B:
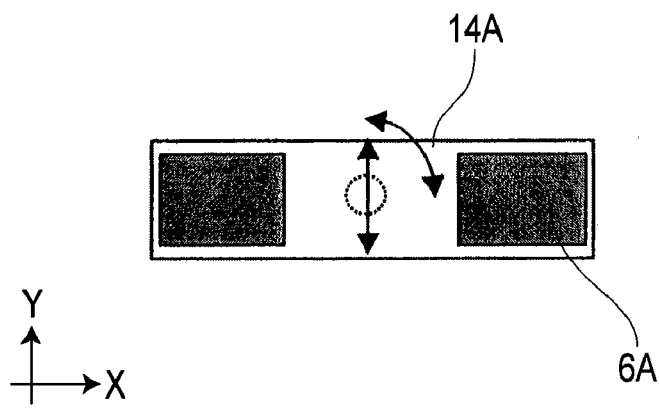
Figure 12A:
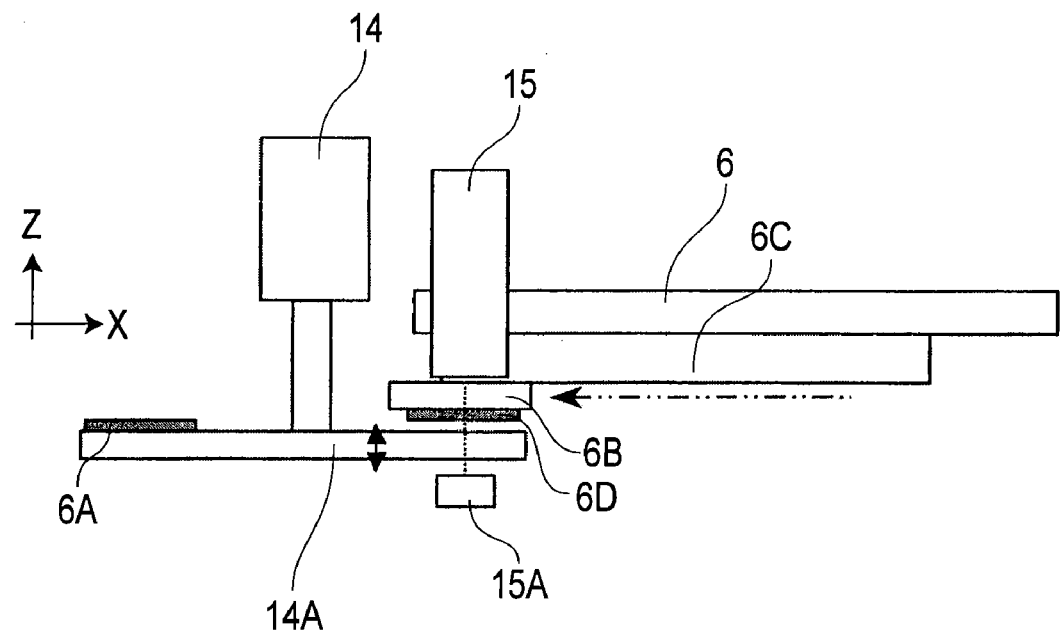
FIGS. 12A and 12B are schematic views for explaining the operation of the reticle alignment mechanism of FIGS. 11A and 11B.
Figure 12B:
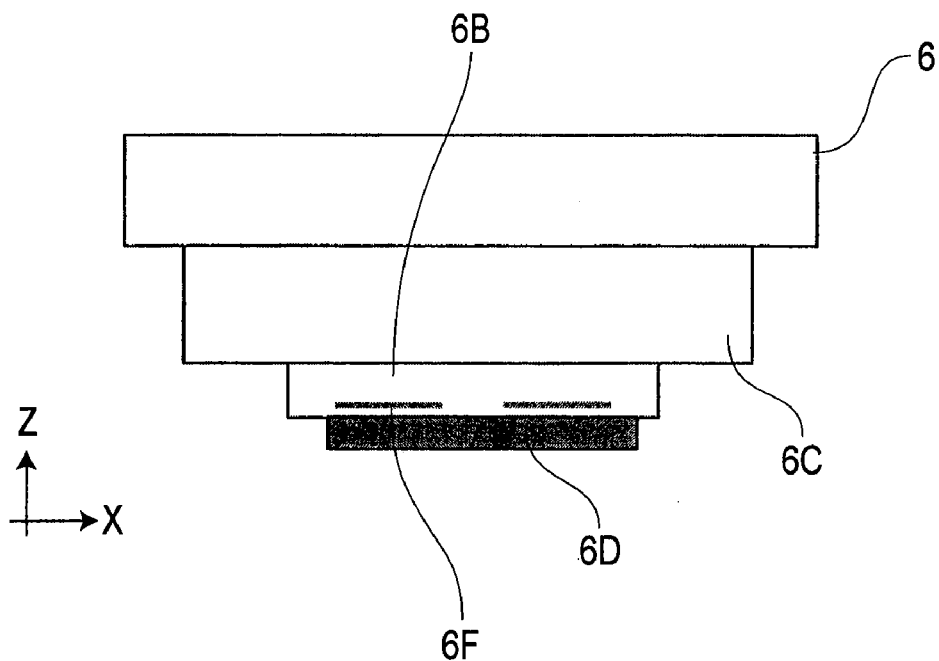
Figure 13A:
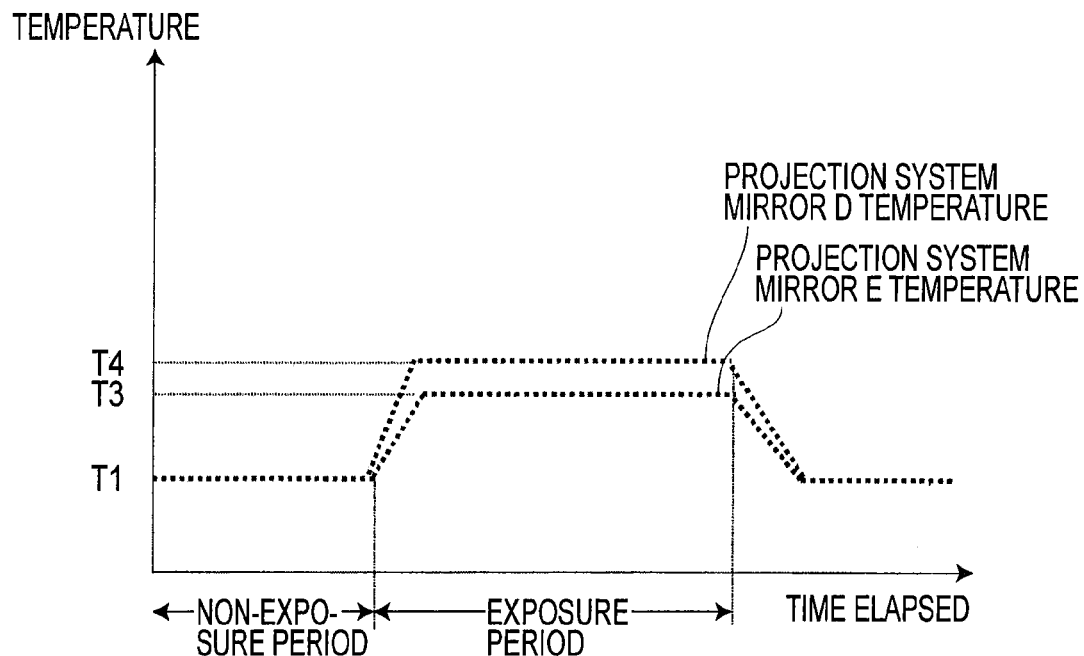
FIGS. 13A and 13B are graphs, for explaining temperature changes of projection system mirrors, in the structures of FIGS. 11A and 11B.
Figure 13B:
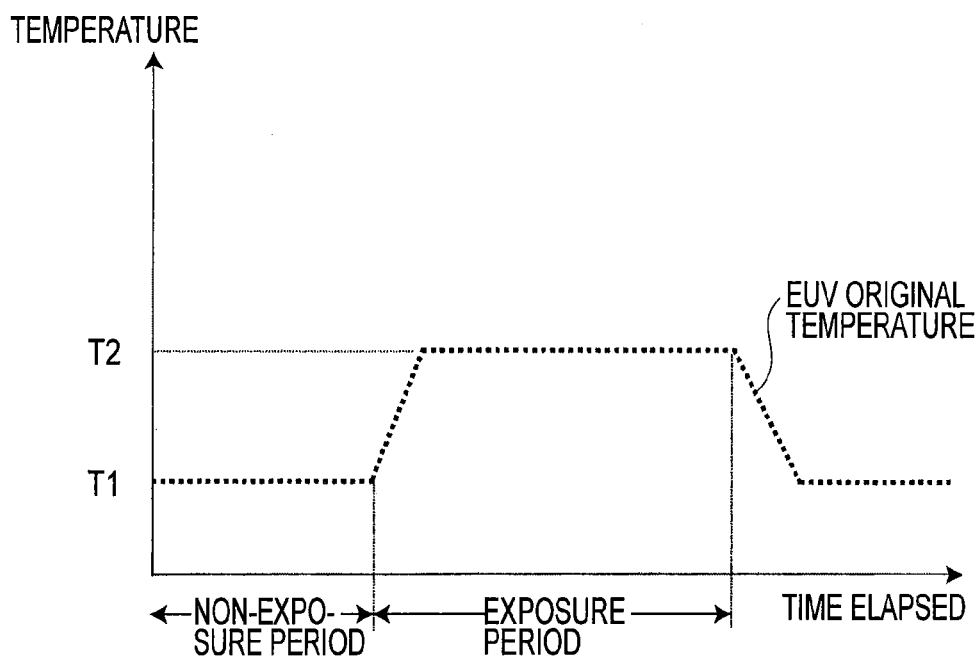

FIG. 10 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer. With these processes, high density microdevices can be manufactured.

The present invention can be embodied in various forms, examples of which are as follows.

(1) An exposure apparatus wherein a pattern formed on an original is projected onto a substrate through a projection optical system while both of the original and the substrate or only the substrate is relatively moved relative to the projection optical system by use of a stage system, whereby the pattern of the original is repeatedly transferred to the substrate, characterized in that radiation temperature-adjusting means is provided at a position spaced with respect to a reflection mirror, which is provided in a projection optical system, in an illumination optical system for supplying exposure light to the projecting optical system, or in an exposure light source unit, and that the temperature of the radiation temperature-adjusting means is made variable approximately in synchronism with a temperature change of the reflection mirror between a non-exposure period and an exposure period.

(2) An exposure apparatus wherein a pattern formed on an original is projected onto a substrate through a projection optical system while both of the original and the substrate or only the substrate is relatively moved relative the projection optical system by use of a stage system, whereby the pattern of the original is repeatedly transferred to the substrate, characterized in that radiation temperature-adjusting means is provided at a position spaced from the surface of the original, and that the temperature of the radiation temperature-adjusting means is made variable approximately in synchronism with a temperature change of the reflection mirror between a non-exposure period and an exposure period.

(3) An exposure apparatus according to items (1) or (2), wherein a set temperature of the radiation temperature-adjusting means is made variable in accordance with an exposure amount, an exposure view angle, an exposure time or any other exposure condition variable that may change the temperature of the reflection mirror or of the original.

(4) An exposure apparatus according to item (2), wherein the radiation temperature-adjusting means is provided at a position spaced from the original, off an exposure light introducing position of an original stage, and wherein, during the non-exposure period, the original stage moves the original to a position opposed to the radiation means to perform the radiation temperature adjustment.

(5) An exposure apparatus according to item (4), wherein, when the original is moved to a position opposed to the radiation means during the non-exposure period, the original stage is moved along the plane of the original surface, relative to the radiation temperature-adjusting means.

(6) An exposure apparatus wherein a pattern formed on an original is projected onto a substrate through a projection optical system while both of the original and the substrate or only the substrate is relatively moved relative to the projection optical system by use of a stage system, whereby the pattern of the original is repeatedly transferred to the substrate, characterized in that radiation temperature-adjusting means is provided to be spaced with respect to a reflection mirror, which is provided in a projection optical system, in an illumination optical system for supplying exposure light to the projection optical system, or in an exposure light unit, that one of optical axis measuring means and wavefront aberration measuring means is provided in relation to a reflection mirror, which is provided in the projection optical system, in the illumination optical system for supplying exposure light to the projection optical system, or in the exposure light source unit, and that when the optical axis adjustment or the wavefront aberration adjustment is carried out during a non-exposure period, temperature adjustment is performed to the reflection mirror through the radiation temperature-adjusting means.

(7) An exposure apparatus according to time (6), wherein a corrective drive amount of reflection mirror position corrective drive means or reflection mirror shape correcting means is calculated and controlled on the basis of a measured value of the radiation temperature-adjusting means and the optical axis measuring means or the wavefront aberration measuring means.

In accordance with these aspects of the present invention, a reflection mirror or an original placed at a light path of exposure light from an exposure light source to a substrate to be exposed is preheated by use of a radiation temperature-adjusting heater, for example, during a period in which the exposure light is not projected to the reflection mirror or the original. This effectively suppresses the temperature change of the reflection mirror or of the original, at the start of exposure, such that distortion of the original pattern or of the reflection mirror can be suppressed, and that degradation of aberration and distortion of a pattern of the original due to the mirror temperature change at the start of exposure can be avoided effectively.

Furthermore, at the optical axis adjustment of the projection optical system or at the aberration adjustment of the reflection mirror, the reflection mirror may be preheated by use of a radiation temperature-adjusting heater, for example. This enables optical axis adjustment or aberration adjustment in a condition equivalent to that of the exposure operation. Thus, degradation of aberration and pattern distortion of the original, resulting from the mirror temperature change at the start of exposure, can be avoided.

In accordance with an aspect of the present invention, a high-precision exposure apparatus can be accomplished, by which translation temperature change of an optical element or of an original at the start of exposure can be avoided, by which distortion of the optical element or of the original pattern can be avoided, and by which degradation of aberration and pattern distortion of the original due to the temperature change of the optical element at the start of exposure can be prevented. Furthermore, at the optical axis adjustment of an illumination optical system or projection optical system or at the aberration adjustment of each optical element, the optical element may be temperature adjusted by preheating, using a radiation temperature-adjusting heater, for example. This enables optical axis adjustment or aberration adjustment in a condition equivalent to that of an exposure operation. Thus, an exposure apparatus, having small aberration and a small change in the period of exposure, can be accomplished.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2003-414579 filed Dec. 12, 2003, which is hereby incorporated by reference.

What is claimed is:

1. An exposure apparatus comprising:
an illumination optical system for illuminating an original with exposure light from a light source;
a projection optical system for projecting a pattern of the original, illuminated by said illumination optical system, onto a substrate;

a radiation member disposed remote from an optical element of said projection optical system and being arranged to heat said optical element;

a controller for controlling a temperature of said optical element through said radiation member; and a measuring system for measuring aberration of said projection optical system, wherein said controller controls the temperature of said optical element so that substantially the same temperature state is kept in an exposure region of said optical element when exposure of the substrate is carried out through the optical element and when exposure of the substrate through the optical element is not carried out, and wherein said measuring system measures the aberration of said projection optical system including said optical element being so controlled by said controller.

2. An exposure apparatus according to claim 1, further comprising an adjusting system for adjusting the aberration of said projection optical system, said adjusting system including an actuator for actuating said optical element, position measuring means for measuring the position of said optical element, and calculating means for calculating a driving amount of said optical element on the basis of measurement by said position measuring means, wherein said actuator drives said optical element on the basis of the driving amount calculated by said calculating means and information obtained through said position measuring means.

3. A measuring method for measuring aberration of a projection optical system which projects a pattern of an original, illuminated with exposure light from a light source, onto a substrate, said method comprising the steps of:

heating an optical element of the projection optical system by use of a radiation member disposed remote from the optical element of the projection optical system;

controlling a temperature of the optical element through the radiation member; and measuring aberration of the projection optical system, wherein, in said controlling step, the temperature of the optical element is controlled so that substantially the same temperature state is kept in an exposure region of said optical element when exposure of the substrate is carried out through said optical element and when exposure of the substrate through said optical element is not carried out, and wherein, in said measuring step, the aberration of the projection optical system including the optical element being so controlled is measured.

4. An adjusting method for adjusting aberration of a projection optical system having an optical element, for projecting a pattern of an original illuminated with light, said method comprising the steps of:

measuring the aberration of the projection optical system, said measuring step comprising the sub-steps of: (i) heating the optical element of the projection optical system by use of a radiation member disposed remote from the optical element of the projection optical system, and (ii) controlling a temperature of the optical element through the radiation member wherein, in said controlling step, the temperature of the optical element is controlled so that substantially the same temperature state is kept in an exposure region of the optical element when exposure of the substrate is carried out through the optical element and when exposure of the substrate through the optical element is not carried out, and wherein, in said measuring step, the aberration of the projection optical system including the optical element being so controlled is measured;

calculating a driving amount of the optical element of the projection optical system on the basis of said measurement step; and driving the optical element of the projection optical system in accordance with the driving amount calculated in said calculating step and with a position of the optical element, thereby to adjust the aberration of the projection optical system.

5. An exposure apparatus, comprising:

an illumination optical system for illuminating an original with exposure light from a light source;

a projection optical system for projecting a pattern of the original, illuminated by said illumination optical system, onto a substrate;

a radiation member disposed remote from an optical element of said projection optical system and being arranged to heat said optical element;

a controller for controlling a temperature of said optical element through said radiation member; and a measuring system for measuring an optical axis of said projection optical system, wherein said controller controls the temperature of said optical element so that substantially the same temperature state is kept in an exposure region of said optical element when exposure of the substrate is carried out through said optical element and when exposure of the substrate through said optical element is not carried out, and wherein said measuring system measures the optical axis of said projection optical system including said optical element being so controlled by said controller.

6. An exposure apparatus according to claim 5, further comprising an adjusting system for adjusting the optical axis of said projection optical system, said adjusting system including an actuator for actuating sail optical element, position measuring means for measuring the position of said optical element, and calculating means for calculating a driving amount of said optical element on the basis of measurement by said position measuring means, wherein said actuator drives said optical element on the basis of the driving amount calculated by said calculating means and information obtained through said position measuring means.

7. A measuring method for measuring an optical axis of a projection optical system which projects a pattern of an original, illuminated with exposure light from a light source, onto a substrate, said method comprising the steps of:

heating an optical element of the projection optical system by use of a radiation member disposed remote from the optical element of the projection optical system;

controlling a temperature of the optical element through the radiation member; and measuring the optical axis of the projection optical system, wherein, in said controlling step, the temperature of the optical element is controlled so that substantially the same temperature state is kept in an exposure region of the optical element when exposure of the substrate is carried out through the optical element and when exposure of the substrate through the optical element is not carried out, and wherein, in said measuring step, the optical axis of the projection optical system including the optical element being so controlled is measured.

8. An adjusting method for adjusting an optical axis of a projection optical system having an optical element, for projecting a pattern of an original illuminated with light, said method comprising the steps of:

measuring the optical axis of the projection optical system, said measuring step including sub-steps of (i) heating the optical element of the projection optical system by use of a radiation member disposed remote from the optical element of the projection optical system, and (ii) controlling a temperature of the optical element through the radiation member, wherein, in said controlling step, the temperature of the optical element is controlled so that substantially the same temperature state is kept in an exposure region of the optical element when exposure of the substrate is carried out through the optical element and when exposure of the substrate through the optical element is not carried out, and wherein, in said measuring step, the optical axis of the projection optical system including the optical element being so controlled is measured;

calculating a driving amount of the optical element of the projection optical system on the basis of said measuring step; and driving the optical element of the projection optical system in accordance with the driving amount calculated in said calculating step and with a position of the optical element, thereby to adjust the optical axis of the projection optical system.

9. An exposure apparatus, comprising:

an illumination optical system for illuminating an original with exposure light from a light source;

a projection optical system for projecting a pattern of the original, illuminated by said illumination optical system, onto a substrate;

a radiation member disposed remote from an optical element of said projection optical system and being arranged to heat said optical element;

a controller for controlling a temperature of said optical element through said radiation member; and a measuring system for measuring aberration and an optical axis of said projection optical system, wherein said controller controls the temperature of said optical element so that substantially the same temperature state is kept in an exposure region of said optical element when exposure of the substrate is carried out through said optical element and when exposure of the substrate through said optical element is not carried out, and wherein said measuring system measures the aberration and the optical axis of said projection optical system including said optical element being so controlled by said controller.

10. An exposure apparatus according to claim 9, further comprising an adjusting system for adjusting the aberration and the optical axis of said projection optical system, said adjusting system including an actuator for actuating said optical element, position measuring means for measuring the position of said optical element, and calculating means for calculating a driving amount of said optical element on the basis of measurement by said position measuring means, wherein said actuator drives said optical element on the basis of the driving amount calculated by said calculating means and information obtained through said position measuring means.

11. A measuring method for measuring aberration and an optical axis of a projection optical system which projects a pattern of an original, illuminated with exposure light from a light source, onto a substrate, said method comprising the steps of:

heating an optical element of the projection optical system by use of a radiation member disposed remote from the optical element of the projection optical system;

controlling a temperature of the optical element through the radiation member; and measuring the aberration and the optical axis of the projection optical system, wherein, in said controlling step, the temperature of the optical element is controlled so that substantially the same temperature state is kept in an exposure region of the optical element when exposure of the substrate is carried out through the optical element and when exposure of the substrate through the optical element is not carried out, and wherein, in said measuring step, the aberration and the optical axis of the projection optical system including the optical element being so controlled are measured.

12. An adjusting method for adjusting aberration and an optical axis of a projection optical system having an optical element, for projecting a pattern of an original illuminated with light, said method comprising the steps of:

measuring the aberration and the optical axis of the projection optical system, said measuring step including sub-steps of (i) heating the optical element of the projection optical system by use of a radiation member disposed remote from the optical element of the projection optical system, and (ii) controlling a temperature of the optical element through the radiation member, wherein, in said controlling step, the temperature of the optical element is controlled so that substantially the same temperature state is kept in an exposure region of the optical element when exposure of the substrate is carried out through the optical element and when exposure of the substrate through the optical element is not carried out, and wherein, in said measuring step, the aberration and the optical axis of the projection optical system including the optical element being so controlled are measured;

calculating a driving amount of the optical element of the projection optical system on the basis of said measuring step; and driving the optical element of the projection optical system in accordance with the driving amount calculated in said calculating step and with a position of the optical element, thereby to adjust the aberration and the optical axis of the projection optical system.

* * * * *

UNITED STATES PATENT AND TRADEMARK OFFICE
CERTIFICATE OF CORRECTION

PATENT NO. : 7,315,347 B2
APPLICATION NO. : 11/006629
DATED : January 1, 2008
INVENTOR(S) : Yoshikazu Miyajima It is certified that error appears in the above-identified patent and that said Letters Patent is hereby corrected as shown below:

COLUMN 3:
　　　Line 33, "any more." should read -- any further. --.
　　　Line 67, "n exposure" should read -- an exposure --.

COLUMN 7:
　　　Line 43, "the whole reflection mirrors" should read -- all of the reflection mirrors --.

COLUMN 9:
　　　Line 9, "is provide" should read -- is provided --.

COLUMN 10:
　　　Line 39, "been process" should read -- been processed --.

COLUMN 14:
　　　Line 37, "sail" should read -- said --.

Signed and Sealed this

Twenty-second Day of July, 2008

JON W. DUDAS
*Director of the United States Patent and Trademark Office*